(12) United States Patent
Ballard et al.

(10) Patent No.: US 7,588,492 B2
(45) Date of Patent: Sep. 15, 2009

(54) AIR PLENUM

(75) Inventors: Curtis C. Ballard, Eaton, CO (US);
Kelly J. Reasoner, Fort Collins, CO (US); Timothy J. Moore, Loveland, CO (US); Gregg S. Schmidtke, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 632 days.

(21) Appl. No.: 11/195,071

(22) Filed: Aug. 1, 2005

(65) Prior Publication Data
US 2007/0026788 A1    Feb. 1, 2007

(51) Int. Cl.
*H05K 7/20* (2006.01)
(52) U.S. Cl. ...................................... 454/184
(58) Field of Classification Search ................. 454/184, 454/237, 251, 154; 361/687, 697, 695
See application file for complete search history.

(56) References Cited

U.S. PATENT DOCUMENTS

| | | | | |
|---|---|---|---|---|
| 4,751,872 A * | 6/1988 | Lawson, Jr. | ................. | 361/695 |
| 6,114,622 A * | 9/2000 | Draeger | ................. | 174/384 |
| 6,315,655 B1 * | 11/2001 | McEwan et al. | ................. | 454/184 |
| 6,359,779 B1 * | 3/2002 | Frank et al. | ................. | 361/687 |
| 6,522,547 B1 * | 2/2003 | Diaz et al. | ................. | 361/724 |
| 6,816,372 B2 * | 11/2004 | Huettner et al. | ................. | 361/695 |
| 6,924,977 B2 * | 8/2005 | Bestwick et al. | ................. | 454/184 |

* cited by examiner

*Primary Examiner*—Steven B McAllister
*Assistant Examiner*—Samantha A Miller

(57) ABSTRACT

An air plenum includes a main body that is sized to enclose at least a portion of a device. The main body extends a distance beyond a port provided on the device and also defines an opening therein that is substantially aligned with the port provided on the device. A cover sized to substantially cover the opening in the main body includes a recessed portion that is inset with respect to a non-recessed portion of the cover by a distance that is about equal to the distance by which the main body extends beyond the port provided on the device. The recessed portion defines an opening therein that is substantially aligned with the port so that the recessed portion in the cover allows a user to access the port on the device.

19 Claims, 7 Drawing Sheets

AIR PLENUM

BACKGROUND

Data storage libraries are well-known in the art and are widely used to store and retrieve large amounts of data. A typical data storage library contains a number of data cartridge storage locations as well as one or more cartridge read/write drives that are used to read data from and/or write data to data cartridges stored within the library. A robotic cartridge access system is commonly used to move the data cartridges between the cartridge storage locations and the cartridge read/write drives.

The cartridge read/write drives utilized in such data storage library systems are often installed in conjunction with an air plenum and fan assembly to facilitate the movement of cooling air through the read/write drive. For example, a commonly used configuration mounts the air plenum adjacent the rear portion of the read/write drive. The air plenum and fan assembly then draw air through the read/write device, cooling the read/write device. Upon exiting the rear portion of the read/write device, the air enters the air plenum, and is ultimately exhausted through the fan assembly.

While such air plenum and fan assemblies are functional and are being used, they are not without their disadvantages. For example, most air plenums cover the entire rear portion of the read/write drive, thereby making it difficult or impossible to access data communication ports (e.g., fiber optic ports) provided on the read/write device without first removing the air plenum. While some air plenum designs utilize a removable cover to allow data cables to be connected to the data communication ports of the read/write drive, the covers may be difficult to replace after the data cables have been connected to the data communication ports. As a consequence, many users may not replace the covers at all, which can result in a loss of cooling air flow through the read/write drive and can also leave exposed sensitive electronic components of the read/write drive.

Partly in an effort to address some of the foregoing shortcomings, air plenums have been designed with port extensions (i.e., port sockets) provided thereon. The port extensions are then connected to the data communication ports on the read/write drives by suitable jumpers (e.g., electrical or optical cables). Thus, a user can access the data communication ports on the read/write device by simply plugging data communication cables into the port extensions provided on the air plenum. While this solution makes it easier to connect data cables to the read/write drive, the presence of the jumpers and port extensions will usually result in some signal loss. Additional difficulties may be involved where the data ports comprise optical data ports. For example, the optical jumpers used to connect the data communication ports on the read/write drive and the port extensions have a limited bend radius, below which significant or total signal loss may occur. Thus, care must be taken in such designs to ensure that the optical jumper cables used to connect the data ports will not be subjected to tight radius turns.

BRIEF DESCRIPTION OF THE DRAWINGS

Illustrative and presently preferred exemplary embodiments of the invention are shown in the drawings in which.

DETAILED DESCRIPTION

Figure 1:
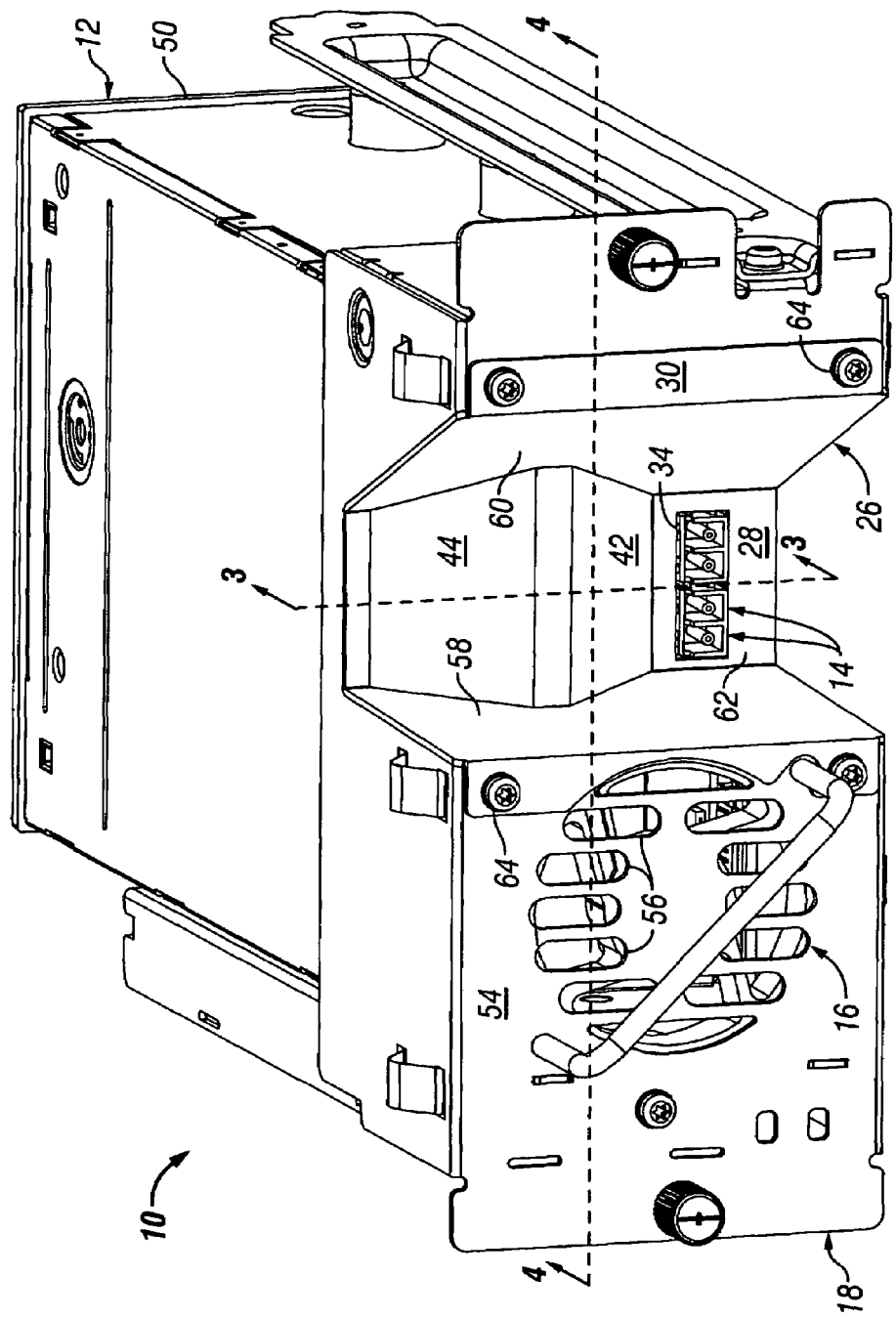
FIG. 1 is a perspective view of one embodiment of an air plenum according to the teachings provided herein.

One embodiment of an air plenum 10 is illustrated in FIG. 1 as it may be used in conjunction with a device 12 having at least one port 14, such as a data communication port, provided therein. In the embodiment illustrated in FIG. 1, the device 12 comprises a cartridge read/write drive that is configured to be mounted in a chassis (not shown) associated with a data storage library. Alternatively, the device 12 could comprise other types of devices utilized in other types of applications. The air plenum 10 is also configured to be mounted to the chassis (not shown) and encloses at least a portion of the device 12, although other arrangements are possible. The air plenum 10 may be provided with a cooling fan 16 that is used to draw air through the device 12, thus cooling the same during operation. Alternatively, other arrangements for moving cooling air through the device 12 are possible, as will be described in further detail below.

Figure 2:
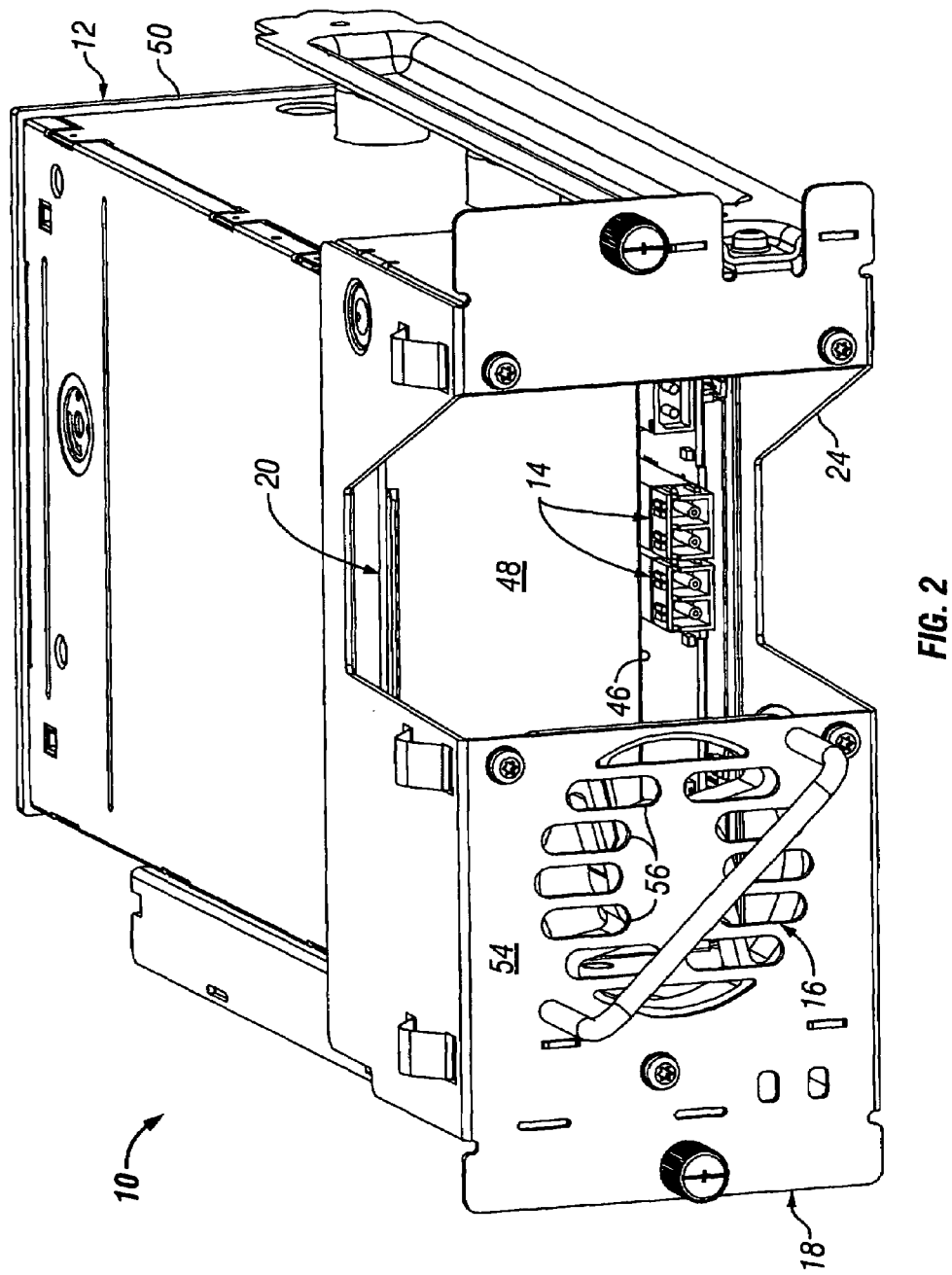
FIG. 2 is a perspective view of the air plenum illustrated in FIG. 1 with the cover removed.
Figure 3:
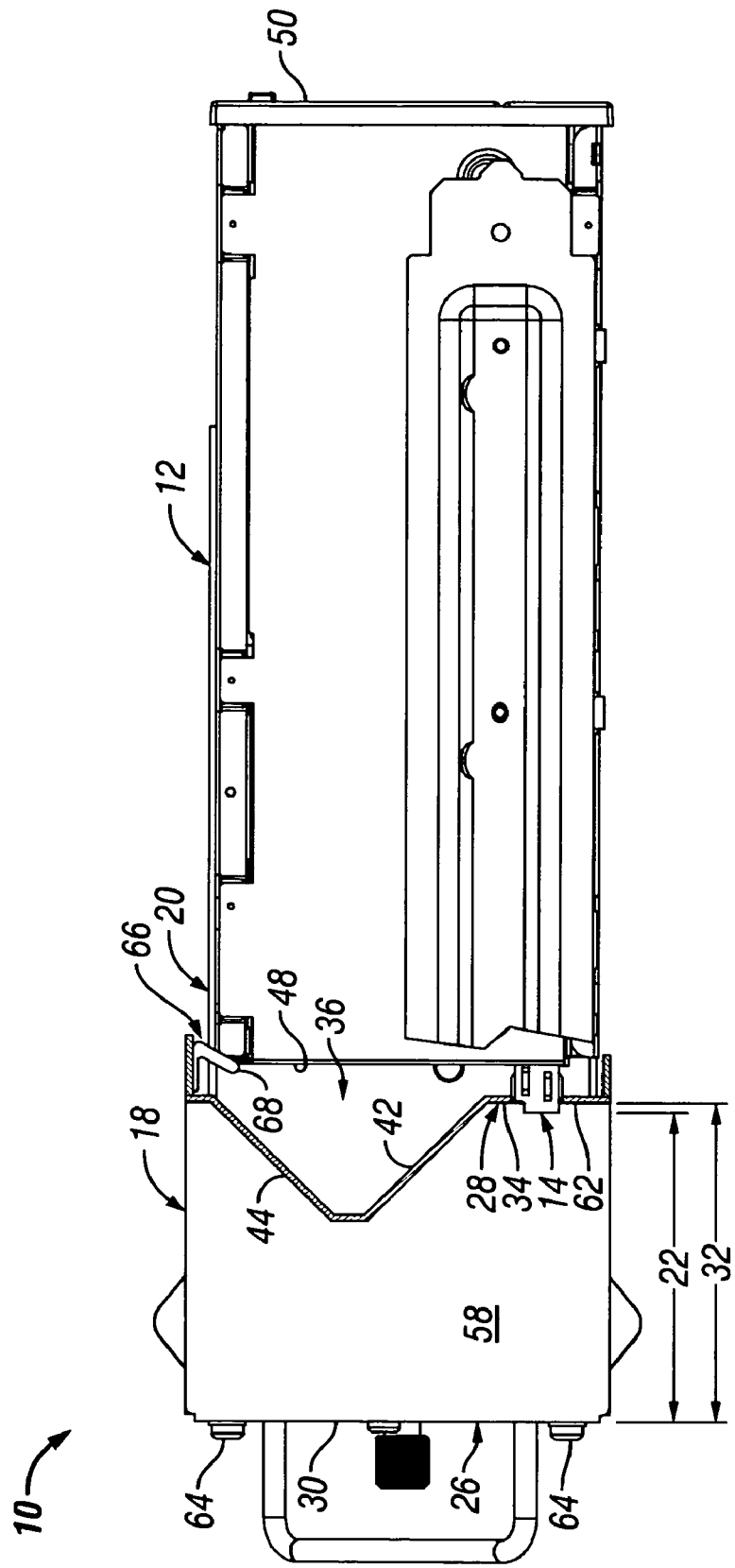
FIG. 3 is a sectional view in elevation taken along the plane 3-3 of FIG. 1.

Referring now to FIGS. 1-4, in one embodiment, the air plenum 10 comprises a main body 18 that is sized to enclose at least a portion, such as the rear section 20 (FIGS. 2 and 3) of device 12. The main body 18 extends a distance 22 beyond the port(s) 14 provided in the device 12, as best seen in FIG. 3. The main body 18 also defines an opening 24 (FIG. 2) therein that is substantially aligned with the port or ports 14 provided on the device 12. A cover 26 substantially covers the opening 24 defined by the main body 18 of air plenum 10. See FIGS. 1, 3, and 4. In the embodiment illustrated in FIGS. 1-4, the cover 26 includes a recessed portion 28 that is inset with respect to a non-recessed portion 30 of cover 26 by a distance 32 that is about equal to the distance 22 by which the main body 18 extends beyond the port(s) 14 on the device 12. See also FIG. 3. The recessed portion 28 defines an opening 34 therein that is substantially aligned with the port(s) 14 provided on the device 12, thereby allowing a user to access the port(s) 14.

Figure 4:
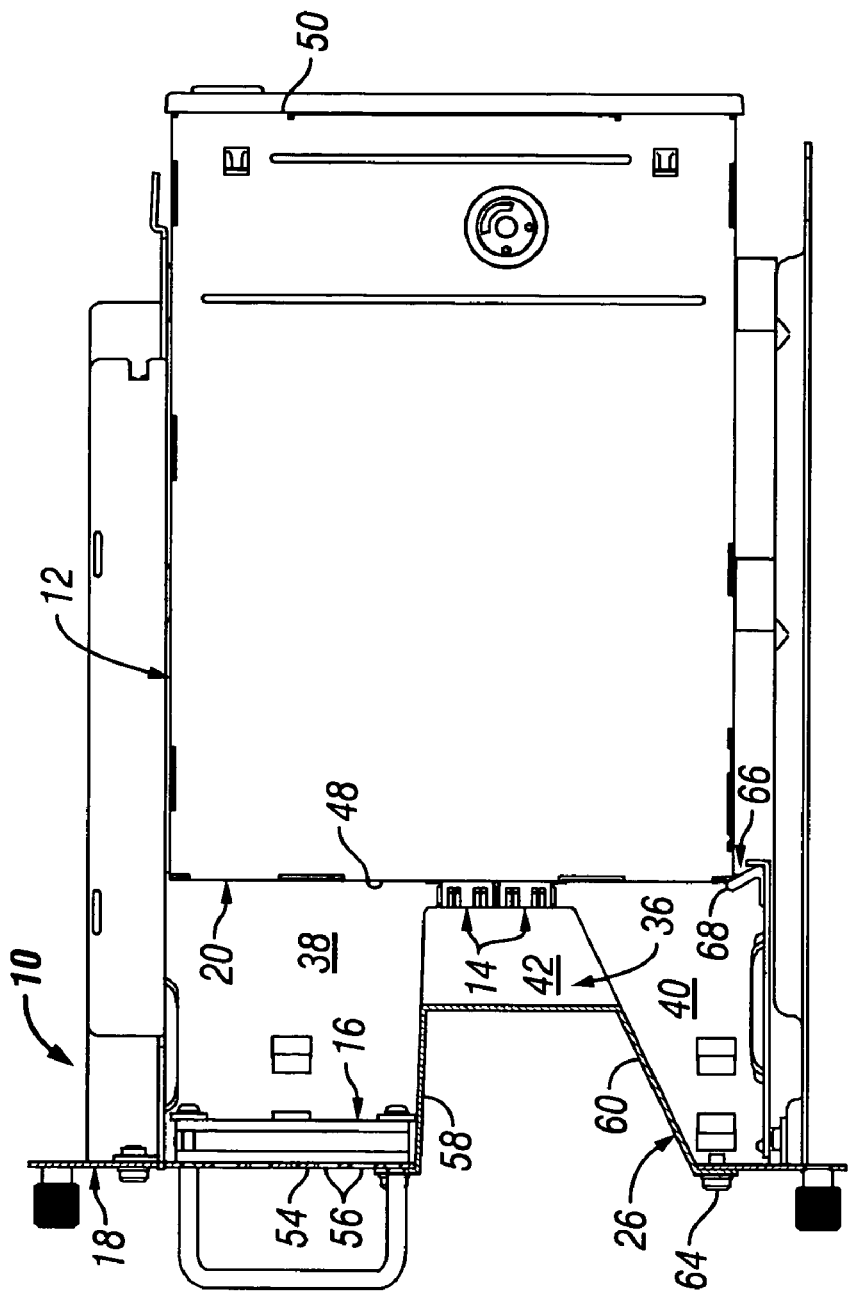
FIG. 4 is a sectional view in plan taken along the plane 4-4 of FIG. 1.

The air plenum 10 may also define an air passageway 36 that improves air flow between a first region 38 and a second region 40 defined between the device 12 and the air plenum 10, as best seen in FIG. 4. In the embodiment illustrated in FIGS. 1-4, the air passageway 36 is formed by a first sloped end portion 42 and a second sloped end portion 44 that are formed in the cover 26, although other arrangements are possible.

The air plenum 10 according to the teachings provided herein allows a user to access the port(s) 14 provided on the device 12, but without the need first remove the cover 26 of the air plenum 10. The air plenum 10 also dispenses with the need to provide jumpers (not shown) or other such extension devices to connect the port(s) 14 provided on the device 12 to corresponding extension ports provided on the air plenum 10. The air passageway 36 provides for improved air flow between regions (e.g., regions 38 and 40) on opposite sides of the port(s) 14, thereby providing for enhanced cooling of the device 12. In addition, the air plenum 10 does not block access to ports provided on other devices stacked either above or below the device 12. Indeed, several identical air plenums 10 and devices 12 may be advantageously vertically stacked without interfering with a user's ability to access the port(s) that may be provided on each such stacked device.

Having briefly described one embodiment of the air plenum 10 according to the teachings provided herein, as well as some of its more significant features and attributes, various exemplary embodiments of the air plenum will now be described in detail. However, before proceeding with the detailed description, it should be noted that while the various embodiments of the air plenum are shown and described herein as they could be used in conjunction with an device 12 that comprises a cartridge read/write drive of the type that may be utilized in a data storage library system, the air plenum 10 may be used in conjunction with other types of devices and in other environments and applications, as would become evident to persons having ordinary skill in the art after having become familiar with the teachings provided herein. For example, in an alternate embodiment, the air plenum 10 could enclose two or more devices (e.g., half-height cartridge read/write drives), in which case air plenum 10 could be provided with a plurality of openings to allow the port(s) of the various devices to be accessed in the manner described herein. Consequently, the air plenum should not be regarded as limited to the specific devices, environments, and applications shown and described herein.

Referring back now to FIGS. 1-4, one embodiment of an air plenum 10 is shown as it could be used in conjunction with a device 12 having one or more ports 14 provided thereon. In the embodiment shown and described herein, the device 12 comprises a read/write drive of the type that may be utilized to read data from and write data to a linear tape open (LTO) data cartridge. Alternatively, the device 12 need not comprise a read/write drive but instead may comprise any of a wide variety of other types of devices that could be used in conjunction with the air plenum 10.

The device 12 shown and described herein includes a port or ports 14 that are used to exchange or transfer data between the device 12 and other systems (e.g., a data storage library system). The port(s) 14 may be provided at any convenient location on the device 12. For example, in one embodiment, the port(s) 14 are accessible through an opening 46 provided on a panel 48 covering the rear section 20 of the device 12, as best seen in FIG. 2. Alternatively, other arrangements are possible.

In the embodiment shown and described herein, the port(s) 14 comprise optical data communication ports. However, it should be noted that other types of data communication ports (e.g., electrical) are known and could also be used. Indeed, the port(s) 14 need not even comprise data ports, but could instead comprise any type of port (e.g., a power supply port or a diagnostic test port) that may be provided on the device 12. Consequently, the present invention should not be regarded as limited to use with any particular type of port.

The air plenum 10 may comprise a main body 18 sized to enclose at least a portion of the device 12. In one embodiment, the main body 18 encloses the rear section 20 of the device 12. When positioned adjacent the device 12, the main body 18 of air plenum 10 extends beyond the port(s) 14 by a distance 22, as best seen in FIGS. 2 and 3. In the embodiment shown and described herein, a small annulus or gap 66 is formed between the main body 18 and the rear-section of the device 12. The gap 66 may be sealed (i.e., made substantially air-tight) by a suitable gasket 68, such as foam tape. The main body 18 may also define an opening 24 (FIG. 2) therein that is substantially aligned with the port(s) 14, so that the same are exposed thereby.

Before proceeding with the description it should be noted that the air plenum 10 could enclose more than one device 12. For example, in an alternative embodiment, a single air plenum 10 could enclose two half-height read/write drives sized to occupy substantially the same space as the full-height read/write drive shown and described herein. Still other alternatives are possible, as would become apparent to persons having ordinary skill in the art after having become familiar with the teachings provided herein. Consequently, the air plenum 10 should not be regarded as limited to the particular configurations and arrangements shown and described herein.

The main body 18 of air plenum 10 may be provided with a cooling fan 16. The cooling fan 16 cools the device 12 by drawing air through the device 12 and exhausting it from the air plenum 10 formed in part by main body 18. The air used for cooling may enter the device 12 through suitable openings, e.g., louvers (not shown), provided on the front panel 50 of device 12. Air may exit the device 12 through suitable openings (e.g., opening 46) provided on the panel 48 covering the rear section 20 of device 12, as best seen in FIG. 2. Alternatively, other arrangements are possible. For example, rather than drawing air through the device 12, the cooling fan may be configured to push air through the device 12.

The cooling fan 16 may be provided at any convenient location depending on the particular application. By way of example, in one embodiment, the cooling fan 16 is mounted to the rear-facing portion 54 of main body 18 of air plenum 10 and exhausts air through openings 56 (FIGS. 1 and 2) provided therein. Alternatively, the cooling fan 16 could be mounted to the exterior of air plenum 10. In still another arrangement, the cooling fan 16 need not be mounted to the air plenum 10 at all, but could be located at a remote location and a suitable duct provided to connect the air plenum 10 to the remotely-mounted cooling fan.

The main body 18 may comprise any of a wide variety of shapes or configurations suitable for the particular device 12 and intended application. Consequently, the main body 18 should not be regarded as limited to any particular shape or configuration. However, by way of example, in the embodiment shown and described herein wherein the air plenum 10 is configured to be used adjacent a full-height LTO data read/write drive, the main body 18 comprises a generally rectangular configuration, as best seen in FIGS. 1 and 2.

The main body 18 may be fabricated from any of a wide range of materials (e.g., metals or plastics) that would be suitable for the intended application. Consequently, the main body 18 should not be regarded as limited to any particular materials. However, by way of example, in one embodiment, the main body 18 is fabricated from sheet metal (e.g., steel).

The air plenum 10 may also comprise a cover 26 (FIG. 1) sized to substantially enclose the opening 24 (FIG. 2) defined by the main body 18. In one embodiment, the cover 26 includes a recessed portion 28 that is inset with respect to a non-recessed portion 30 of cover 26 by a distance 32 that is about equal to the distance 22 by which the main body 18 extends beyond the port(s) 14 on the device 12. See FIG. 3. The recessed portion 28 defines an opening 34 therein that is substantially aligned with the port(s) 14 provided on the device 12. The cover 26 thereby allows a user to access the port(s) 14.

If the air plenum 10 encloses two or more devices 12 (e.g., in the case where each such device comprises a half-height read/write drive), then the cover 26 may be provided with a suitable number of openings 34 to allow the user to access the data communications port(s) 14 provided on each device 12.

The air plenum 10 may also define an air passageway 36 that allows for improved air flow between a first region 38 and a second region 40 defined between the device 12 and the air plenum 10, as best seen in FIG. 4. In one embodiment, the air passageway 36 is formed by a first sloped end portion 42 and a second sloped end portion 44 that are formed in the cover 26, although other arrangements are possible. As best seen in FIG. 1, the cover 26 may also be provided with first and second sidewall portions 58 and 60 that extend between the first and second sloped end portions 42 and 44, a generally flat bottom portion 62 of recessed portion 28, and the non-recessed portion 30 of cover 26.

The cover 26 may be fabricated from any of a wide range of materials (e.g., metals or plastics) suitable for the intended application. Consequently, the cover 26 should not be regarded as limited to any particular material. However, by way of example, in one embodiment, the cover 26 is fabricated from sheet metal (e.g., steel).

The cover 26 may be attached to the main body 18 by any of a wide range of fasteners, such as screws 64, although other fastening systems and methods are known and could also be used. Alternatively, the cover 26 need not be formed separately and could instead be formed along with the main body 18 from a single piece of material. So forming the cover 26 and main body 18 from a single piece of material is easily possible if both cover 26 and main body 18 are formed of plastic, although it is possible to do so even if the material comprises sheet metal.

In use, i.e., when the air plenum 10 has been positioned adjacent the device 12, the air plenum 10 will substantially enclose the rear section 20 of the device 12. Thereafter, a suitable air extraction device, such as cooling fan 16, may be operated to lower the pressure in the regions (e.g., 38 and 40) between the air plenum 10 and the device 12. The reduced pressure will cause air to flow through the device 12, and ultimately exit the device 12 through openings (e.g., opening 46) provided in the panel 48 of device 12. The air passageway 36 allows for an increased flow of air between regions on opposite sides of the ports 14 (i.e., regions 38 and 40), thereby improving overall cooling efficiency. In addition, the recessed portion 28 formed in the cover 26 of air plenum 10 allows the port(s) 14 of the device 12 to be readily accessed by a user without the need to remove the cover 26 and without the need for separate jumpers.

Figure 5:
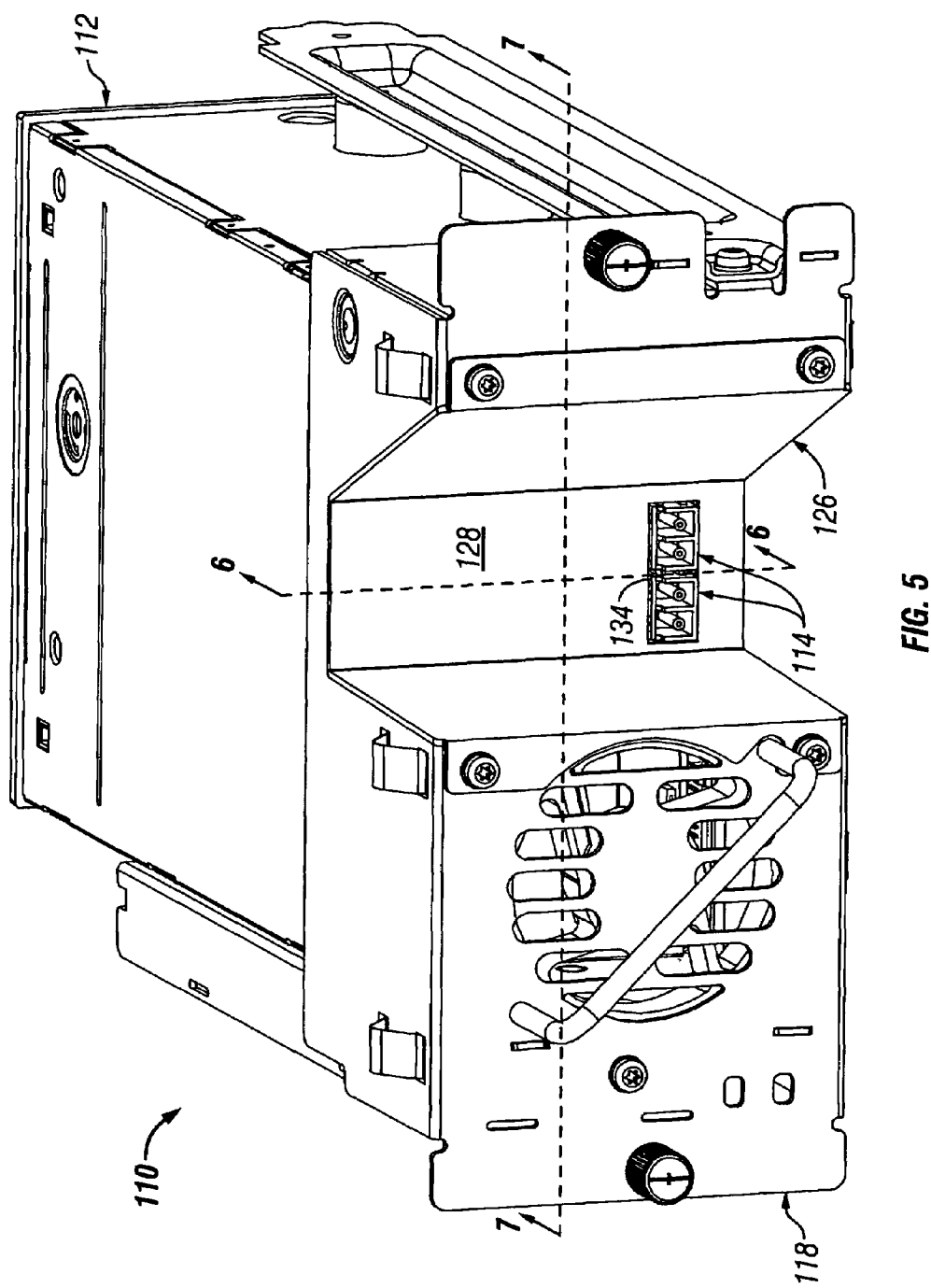
FIG. 5 is a perspective view of another embodiment of an air plenum.
Figure 6:
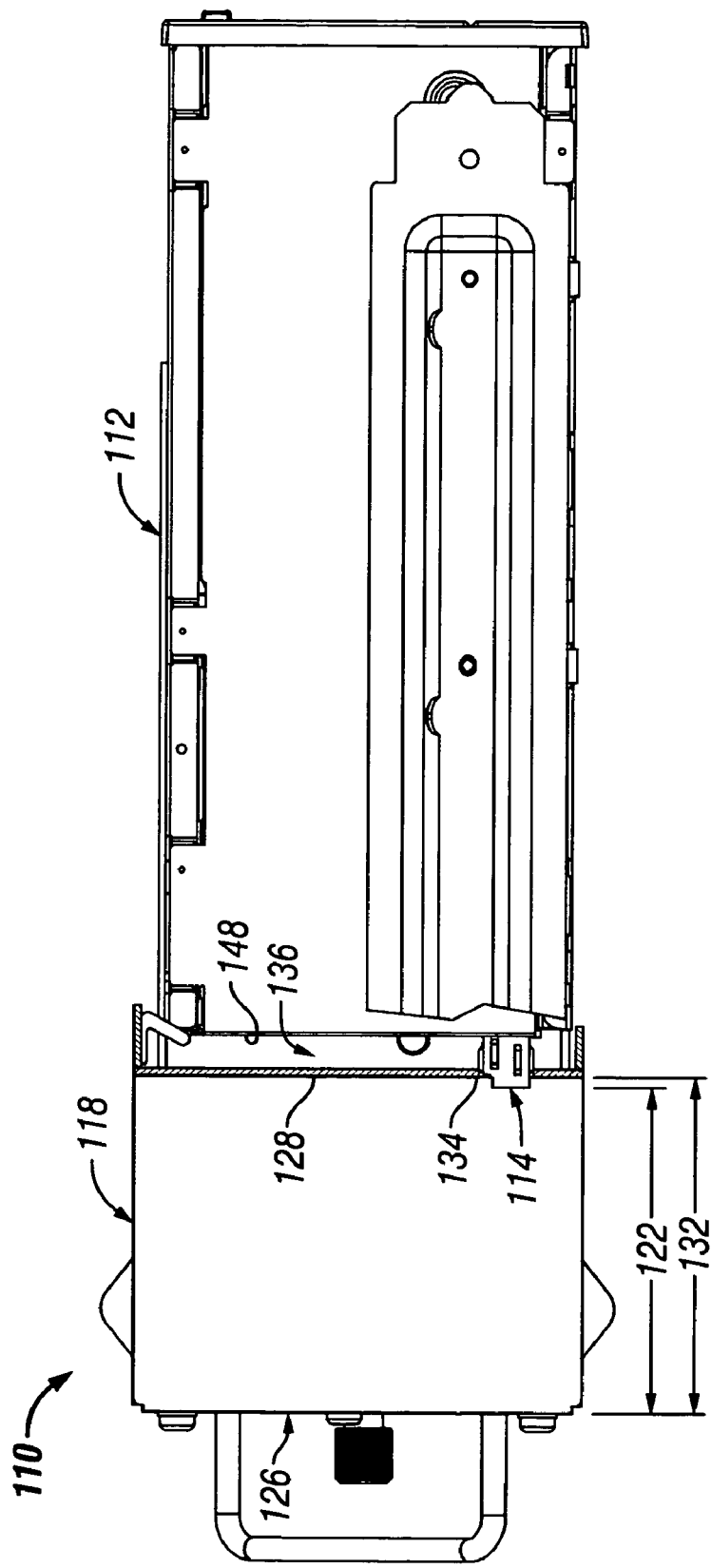
FIG. 6 is a sectional view in elevation taken along the plane 6-6 of FIG. 5.
Figure 7:
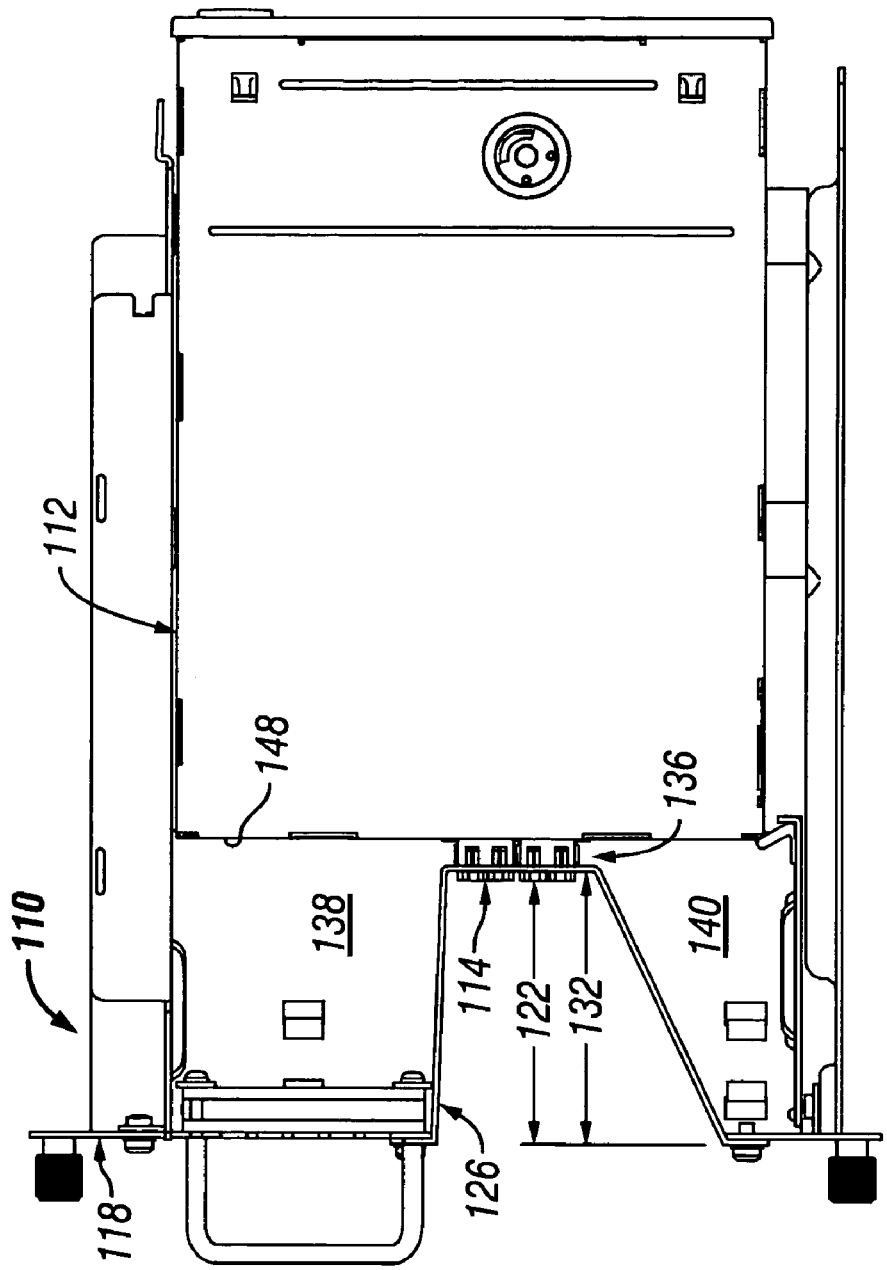
FIG. 7 is a sectional view in plan taken along the plane 7-7 of FIG. 5.

Another embodiment 110 of an air plenum according to the teachings provided herein is illustrated in FIGS. 5-7. Air plenum 110 comprises a main body 118 that is sized to enclose at least a portion of a device 112. In the embodiment shown and described herein, the main body 118 is substantially similar to main body 18 of the embodiment 10 already described and will not be described in further detail herein. The air plenum 110 may also comprise a cover 126 having a recessed portion 128 that is inset by a distance 132 that is about equal to the distance 122 that the main body 118 extends beyond ports 114 provided in device 112. See FIGS. 6 and 7. Recessed portion 128 defines an opening 134 therein that is substantially aligned with the ports 114, so that the same may be accessed by a user. Cover 126 does not include sloped end portions (such as sloped end portions 42 and 44 of the embodiment illustrated in FIGS. 1-4). Consequently, the air passageway 136 defined generally between cover 126 and a panel 148 of device 112 may have a smaller cross-sectional area compared with that associated with the embodiment illustrated in FIGS. 1-4. However, the air passageway 136 may provide sufficient air flow between regions 138 and 140 on opposite sides of ports 114 in many applications.

Having herein set forth preferred embodiments of the present invention, it is anticipated that suitable modifications can be made thereto which will nonetheless remain within the scope of the invention. The invention shall therefore only be construed in accordance with the following claims.

The invention claimed is:

1. An air plenum, comprising:
    a main body sized to enclose at least a portion of a device, said main body extending a distance beyond a port provided on the device, said distance creating an area between the device and said main body to house an air extraction device, said main body defining an opening therein that is substantially aligned with the port provided on the device; and
    a cover sized to substantially cover the opening defined by said main body, said cover including a recessed portion that is inset with respect to a non-recessed portion of said cover by a distance that is about equal to the distance by which the main body extends beyond the port provided on the device so that said recessed portion is in close adjacent relationship to the port, the recessed portion defining an opening therein that is substantially aligned with the port, the recessed portion in said cover allowing a user to access the port on the device.

2. The air plenum of claim 1, wherein said cover further defines an air passageway, the air passageway allowing air flow between a first region and a second region, the first region being defined generally between said cover and a portion of the device on a first side of the port, the second region being defined generally between said cover and a portion of the device on a second side of the port.

3. The air plenum of claim 2, wherein said cover further comprises:
    a generally flat bottom portion, said generally flat bottom portion defining the opening in the recessed portion;
    a first sloped end portion that extends between said generally flat bottom portion and a position between the recessed portion and the non-recessed portion of said cover; and
    a second sloped end portion that extends between said first sloped end portion at the position between the recessed portion and the non-recessed portion of said cover and side portion between said generally flat bottom portion and the recessed portion, said first and second sloped end portions comprising said air passageway.

4. The air plenum of claim 3, wherein said cover further comprises:
    a first sidewall portion extending between said first and second sloped end portions, said generally flat bottom portion, and a non-recessed portion of said cover; and
    a second sidewall portion extending between said first and second sloped end portions, said generally flat bottom portion, and a non-recessed portion of said cover, said first and second sidewall portions being located on opposite sides of said generally flat bottom portion.

5. The air plenum of claim 1, wherein said main body and said cover are fabricated from sheet metal.

6. The air plenum of claim 1, wherein said main body and said cover are formed from a single piece of material.

7. Apparatus, comprising:
    a device having a port provided thereon;
    an air plenum having a body sized to enclose at least a portion of said device, said air plenum having at least one open end that extends a distance beyond the port provided on said device, the distance forming an enclosure between the device and the body to contain an air extraction device; and an air plenum cover having a recessed portion thereon that is inset with respect to a non-recessed portion of said air plenum cover by a distance that is about equal to the distance by which said air plenum extends beyond the port provided on said device so that said recessed portion is in close adjacent relationship to the port, the recessed portion defining an opening therein that is substantially aligned with the port.

8. The apparatus of claim 7, wherein said air plenum cover further defines an air passageway, the air passageway allowing air flow between a first region and a second region, the first region being defined generally between said cover and a portion of said device on a first side of the port, the second region being defined generally between said cover and a portion of said device on a second side of the port.

9. The apparatus of claim 7, wherein the port comprises an optical communication port.

10. The apparatus of claim 8, wherein the recessed portion comprises:
- a generally flat bottom portion, said generally flat bottom portion defining the opening in the recessed portion;
- a first sloped end portion that extends between said generally flat bottom portion and a position between the recessed portion and the non-recessed portion of said air plenum cover; and
- a second sloped end portion that extends between said first sloped end portion at the position between the recessed portion and the non-recessed portion of said air plenum cover and side portion between said generally flat bottom portion and the recessed portion, said first and second sloped end portions comprising said air passageway.

11. The apparatus of claim 10, further comprising:
- a first sidewall portion extending between said first and second sloped end portions, said generally flat bottom portion, and a non-recessed portion of said air plenum cover; and
- a second sidewall portion extending between said first and second sloped end portions, said generally flat bottom portion, and a non-recessed portion of said air plenum cover, said first and second sidewall portions being located on opposite sides of said generally flat bottom portion.

12. The apparatus of claim 7, wherein said device further comprises a panel having an opening therein, wherein said at least one port is aligned with the opening in the panel of said device.

13. The apparatus of claim 7, wherein said air plenum cover is fabricated from sheet metal.

14. The apparatus of claim 7, wherein said device comprises a plurality of ports positioned in adjacent relationship and wherein the opening defined by the recessed portion of said air plenum cover is substantially aligned with the plurality of ports so that said plurality of ports can be accessed by a user.

15. The apparatus of claim 7, wherein said device comprises a plurality of ports and wherein the recessed portion defines a plurality of openings therein that are substantially aligned with the plurality of ports.

16. Apparatus, comprising:
- a device having a port provided thereon;
- an air plenum having a body sized to enclose at least a portion of said device, said body having an open end that extends a distance beyond the port provided on said device, said distance creating an area between the device and said body to house an air extraction device; and
- air plenum cover means for enclosing the open end of said air plenum, for allowing a user to access the port provided on said device, and for allowing air to flow generally around the port in an enclosed volume defined between (1) said device, (2) the portion of said air plenum that extends a distance beyond the port, and (3) said air plenum cover means.

17. The apparatus of claim 16, wherein said air plenum cover means comprises port access means for allowing a user to access the port provided on said device.

18. The apparatus of claim 17, wherein said port access means substantially prevents air from entering the enclosed volume defined between said device, the portion of the air plenum that extends a distance beyond the port, and said air plenum cover means.

19. The apparatus of claim 17, wherein said air plenum cover means comprises air flow means for allowing air to flow generally around the port.

* * * * *